(12) United States Patent
Khanna et al.

(10) Patent No.: US 7,109,749 B2
(45) Date of Patent: Sep. 19, 2006

(54) PROGRAMMABLE LOGIC DEVICES PROVIDING REDUCED POWER CONSUMPTION

(75) Inventors: Namerita Khanna, New Delhi (IN); Parvesh Swami, New Delhi (IN); Deepak Agarwal, Noida (IN)

(73) Assignee: STMicroelectronics, Pvt. Ltd., IN (US)

( * ) Notice: Subject to any disclaimer, the term of this patent is extended or adjusted under 35 U.S.C. 154(b) by 0 days.

(21) Appl. No.: 10/449,750

(22) Filed: May 29, 2003

(65) Prior Publication Data

US 2004/0008055 A1    Jan. 15, 2004

(30) Foreign Application Priority Data

May 29, 2002   (IN) .................. 593/DEL/2002

(51) Int. Cl.
    *H03K 19/177*   (2006.01)
(52) U.S. Cl. ................... 326/40; 326/37; 326/38; 327/201

(58) Field of Classification Search ................ 327/295, 327/298, 403, 404, 407, 544, 218, 203, 210, 327/199, 212, 171, 166
See application file for complete search history.

(56) References Cited

U.S. PATENT DOCUMENTS

| | | | |
|---|---|---|---|
| 5,793,236 A * | 8/1998 | Kosco | 327/218 |
| 5,844,844 A * | 12/1998 | Bauer et al. | 365/189.05 |
| 6,072,348 A * | 6/2000 | New et al. | 327/295 |
| 6,137,331 A * | 10/2000 | Peset Llopis | 327/199 |
| 6,608,513 B1 * | 8/2003 | Tschanz et al. | 327/218 |
| 6,720,813 B1 * | 4/2004 | Yee et al. | 327/218 |
| 6,938,225 B1 * | 8/2005 | Kundu | 716/1 |
| 6,943,605 B1 * | 9/2005 | Thadikaran et al. | 327/218 |

* cited by examiner

*Primary Examiner*—Vibol Tan
(74) *Attorney, Agent, or Firm*—Lisa K. Jorgenson; Graybeal Jackson Haley; Paul F. Rusyn

(57) ABSTRACT

A Programmable Logic Device providing reduction in power consumption for sequential logic and data storage functions, including at least one circuit arrangement configurable to function as a dual-edge-triggered flip-flop operating on a selected one or both edges of the circuit clock.

22 Claims, 7 Drawing Sheets

PROGRAMMABLE LOGIC DEVICES PROVIDING REDUCED POWER CONSUMPTION

PRIORITY CLAIM

This application claims priority from Indian patent application No. 593/Del/2002, filed May 29, 2002, which is incorporated herein by reference.

FIELD OF THE INVENTION

This invention relates generally to Programmable Logic Devices providing reduced power consumption for a given system performance.

BACKGROUND OF THE INVENTION

Programmable Logic Devices (PLDs) are semi-custom devices incuding a fixed set of logic structures which may be interconnected in several different ways to achieve a desired logic function. PLDs generally include an array of Programmable Logic Blocks (PLBs). A PLB may also be called a Configurable Logic Block (CLB), or a Configurable Logic Element (CLE), or Programmable Function Unit (PFU). Each PLB is a programmable logic circuit comprising one or more input lines, one or more output lines, one or more latches, and one or more Look-Up Tables (LUTs) along with sequential logic elements. Each LUT can be programmed to perform various functions including general combinatorial or control logic, or to operate as a Read Only Memory (ROM), Random Access Memory (RAM), or as a data path between input and output lines. In this manner, the LUT determines whether the PLB performs general logic, or operates in a special mode such as an adder, a subtracter, a counter, a register, or a memory cell.

As the size and speed of PLDs increase, the power consumption also increases. The device architecture directly affects the power efficiency which can be expected in any design. PLDs generally use low-power technologies such as CMOS technology. However, in high-density PLDs the power-consumption issue becomes a limiting factor in spite of the low-power technology used. This results in the limitation that all the resources (logic blocks, routing, etc.) of the device cannot be used at the maximum speed owing to excessive temperature rise. The power consumption of the device also directly affects reliability and cost. Almost all power consumption in PLDs is dynamic powerbecause it is the result of charging and discharging of internal and external capacitance. One of the main causes of dynamic power consumption in PLDs is clock-distribution power. High-speed switching in clock distribution results in considerably higher power consumption. Thus, it is typically safe to operate a PLD device at lower speed with a low-cost package without any heat sink. However, at high speed the reliability of the device can typically be sustained only by using an expensive package alone or together with a heat sink.

Furthermore, sequential logic elements and data-storage circuit elements including memory cells incorporate edge-triggered flip-flops as the basic building block. These flip-flops, being edge-triggered, operate on only a specific edge of the clock signal. The remaining edge of the clock signal typically does not produce any circuit action. However, the unused edge does contribute to an equal amount of wasteful power dissipation. It is therefore desirable to have a mechanism that enables useful operation on the unused clock edges.

SUMMARY OF THE INVENTION

An embodiment of the invention provides a Programmable Logic Device with reduced power consumption at a given system performance.

This embodiment provides a Programmable logic Device (PLD) comprising Programmable Logic Blocks incorporating circuit arrangements of single edge flip-flops that are configurable for functioning as dual-edge triggered flip-flops operating on both edges of the clock signal so as to perform functions at an increased rate for a given clock frequency. In dual-edge triggered mode, one of the flip-flops receives the clock directly while the other flip-flop receives the clock after inversion. The final output being obtained by multiplexing the outputs from the two flip-flops with the clock selecting the active output. The circuit arrangement can be used as a memory element in a PLD and can be programmed to function as either a normal or a dual-edge flip-flop.

BRIEF DESCRIPTION OF THE ACCOMPANYING DRAWINGS

The objects and advantages of the invention will become more apparent in reference to the following description and the accompanying drawings, wherein.

DETAILED DESCRIPTION

Figure 1:
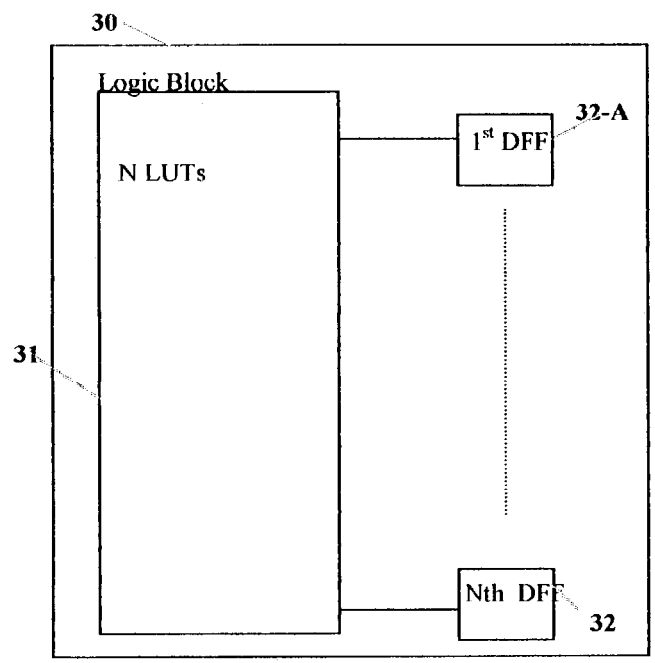
FIG. 1 shows a block diagram of conventional Programmable Logic Block.

As shown in FIG. 1, a conventional PLB 30 includes LUTs 31, and one or more registering elements 32. Each registering element is typically a D flip-flop.

Figure 2:
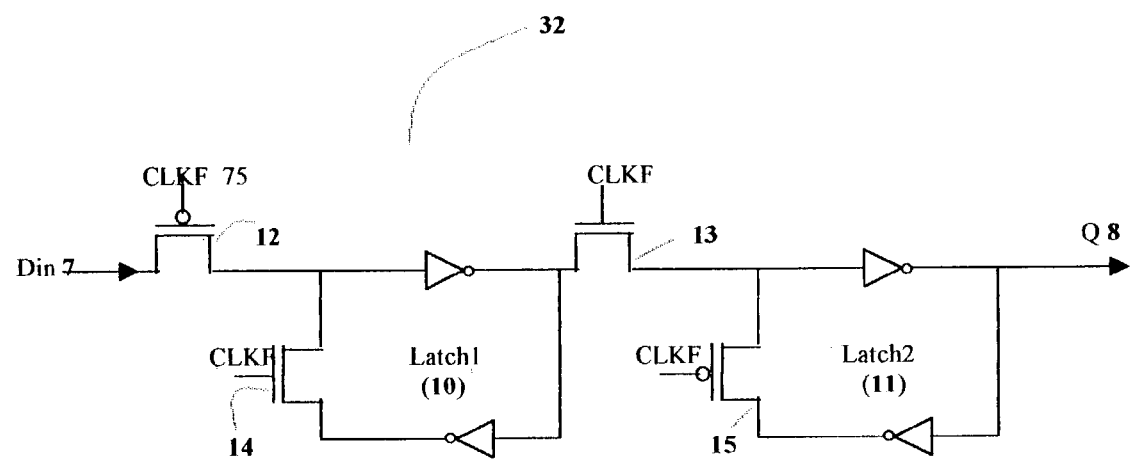
FIG. 2 shows the internal circuit of a conventional rising edge D flip-flop

FIG. 2 shows the internal structure of a conventional D flip-flop 32. D flip-flop 32 comprises data latches 10, 11 connected in series through transistor switches 12, 13, 14, and 15 as shown. The input at Din 7 is connected sequentially to the output Q 8 on triggering the circuit at the rising edge of a clock cycle.

Figure 3:
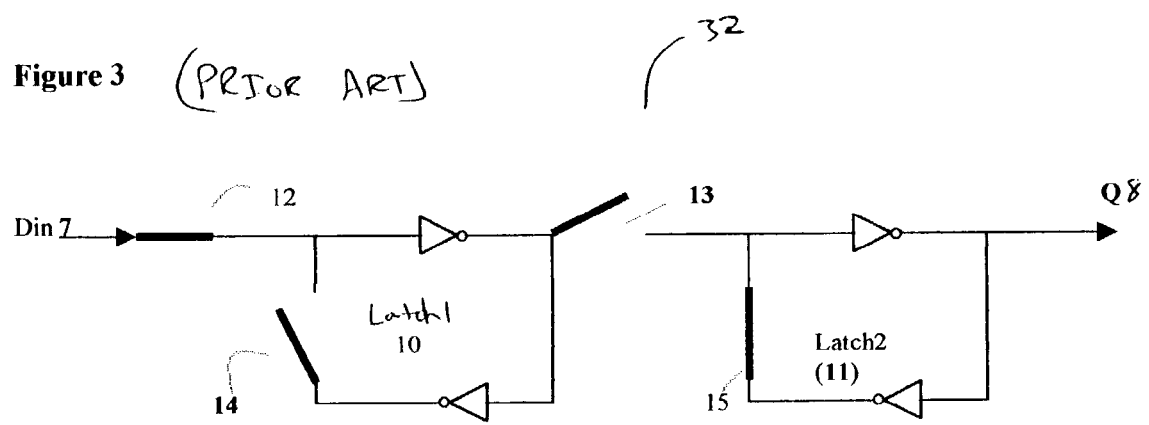
FIG. 3 shows the internal state of a conventional rising edge D flip-flop at CLK=0.

FIG. 3 shows the internal states of the rising-edge-triggered D flip-flop 32 of FIG. 2 when the clock control signal CLKF 75 is at logical "0". Switches 12 and 15 are ON while switches 13 and 14 are OFF. As a result Din 7 is passed to latch1 10, but is not latched into it and is also not passed to latch2 11. Switch 15 is ON in this mode, hence, latch 11 provides the D flip-flop output Q 8.

Figure 4:
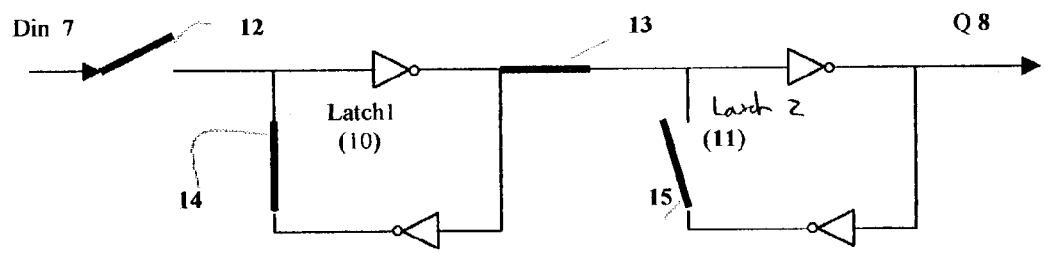
FIG. 4 shows the internal state of a conventional rising edge D flip-flop at CLK=1.

FIG. 4 shows the internal states of the D flip-flop 32 when the clock CLKF 75 switches to "1". Switches 12 and 15 are now OFF while switches 13 and 14 are ON. In this case, latch 10 is active and the information latched in latch 10 is passed through switch 13 to latch2 11. The data is not latched in latch 11 since switch 15 is open and the output of the flip-flop Q 8 is provided with the data that was latched into latch 10 in the previous clock transition.

Figure 5:
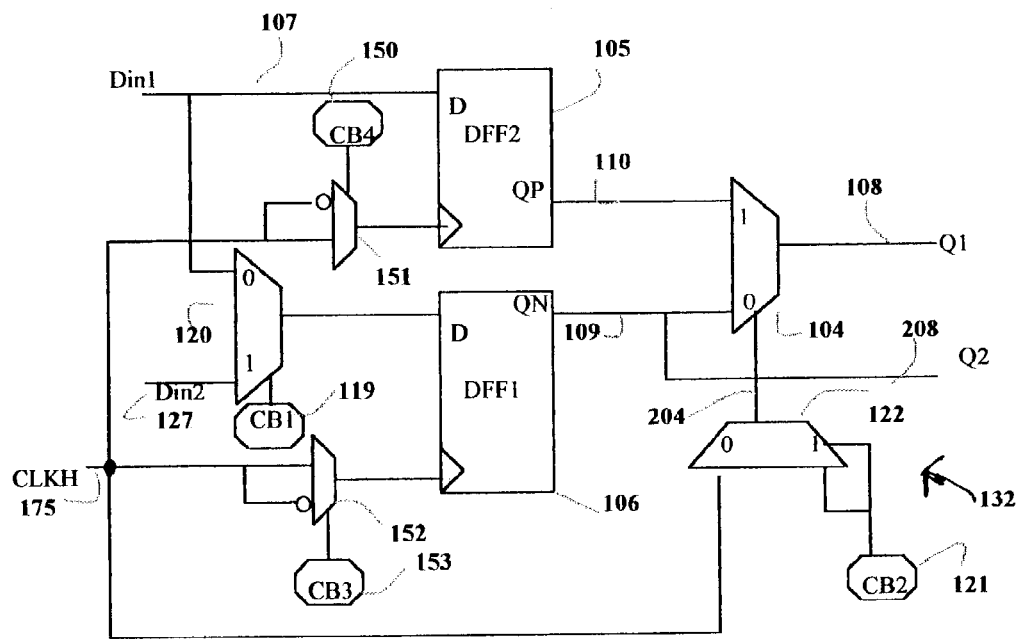
FIG. 5 shows a dual-edge-triggered D flip-flop system according to an embodiment of the present invention.

FIG. 5 shows a dual-edge-triggered flip-flop system 132 according to an embodiment of the invention. The system receives two data inputs Din1 107 and Din2 127 and a clock input CLKH 175 for generating two outputs Q1 108 and Q2 208. D flip-flops DFF2 105 and DFF1 106 are positive (rising) edge type of flip-flops. Flip-flop DFF1 106 has a multiplexer 152 at its clock input to select a direct clock input or inverted clock input based on configuration bit CB3 153. This selection can be used to configure the DFF1 106 as a positive-edge-triggered flip-flop when direct clock input is selected or a negative-edge-triggered flip-flop when an inverted clock is selected. Similarly, flip-flop DFF2 105 has a clock-input multiplexer 151 to make the flip-flop positive-edge-triggered or negative-edge triggered on the basis of configuration bit CB4 150. Input Din1 107 is a dedicated input for flip-flop DFF2 105 and an optional input for flip-flop DFF1 106 whereas input Din2 127 is an optional input for flip-flop DFF1 106. Multiplexer 120 selects one of the inputs 107 or 127 for flip-flop DFF1 106 according to the value of configuration data CB1 119. In this example, input 107 is selected when configuration bit 119 is "0", otherwise Din2 127 is selected. A second multiplexer 104 selects one of the flip-flop outputs 109 or 110 according to the value on select line 204, for final output 108. A third multiplexer 122 is used to provide the select line signal 204 for multiplexer 104 according to configuration data CB2 121. Clock signal 175 is used as a select line 204 if configuration data CB2 121 is set to "0" and select line 204 is set to "1" if configuration data CB2 121 is set to "1". Clock signal 175 is common for both flip-flops DFF2 105 and DFF1 106.

Figure 6:
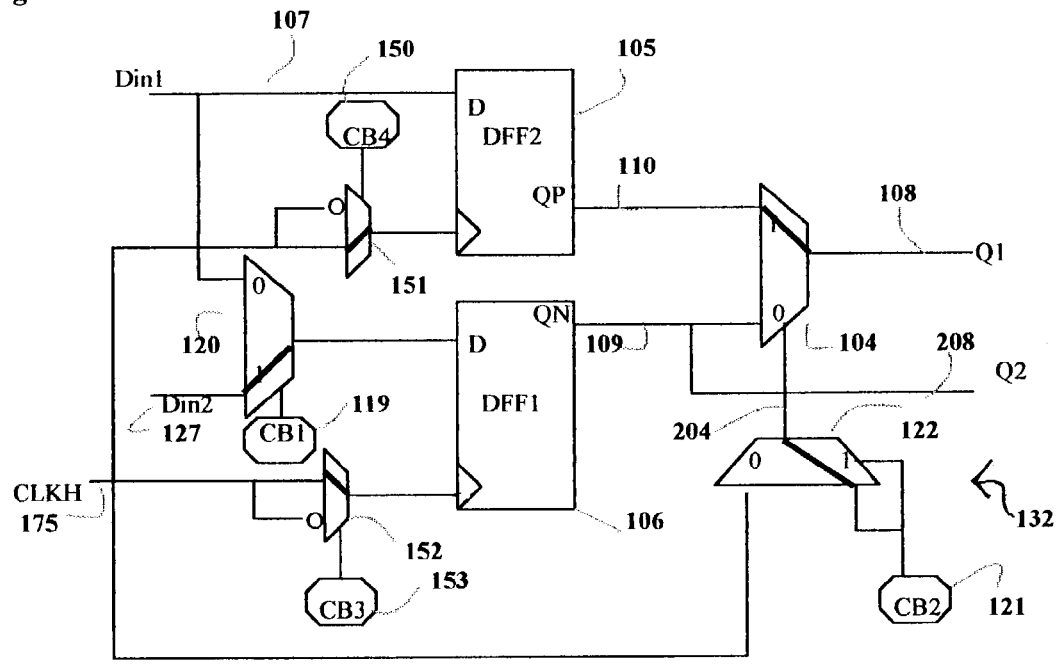
FIG. 6 shows the internal operation of the dual-edge-triggered flip-flop system of FIG. 5 for single-edge configuration mode according to an embodiment of the invention.

FIG. 6 describes the operation of the dual-edge-triggered flip-flop system 132 when configured for single-edge mode. In this mode, multiplexers 151 and 152 select the normal clock inputs for flip-flops DFF1 106 and DFF2 105. At the same time, configuration data 119 is set to "1" and multiplexer 120 selects data source Din2 127 as the data input for flip-flop DFF1 106. Further, configuration data CB2 121 makes select line 204 "1" using multiplexer 122. This selects the DFF2 flip-flop output QP 110 as multiplexer 104 output Q1 108. DFF1 flip-flop output QN 109 is also available at Q2 208 output. At the positive edge of clock 175, flip-flop DFF2 105 registers the data Din1 107 for output Q1 108 whereas flip-flop DFF1 106 is used to register data Din2 127 at the positive edge of clock 175 for output Q2 208. Accordingly, in this mode, this system 132 provides a normal operation with both flip-flops 105 and 106 registering their respective data inputs at the positive edge of clock 175.

Figure 7:
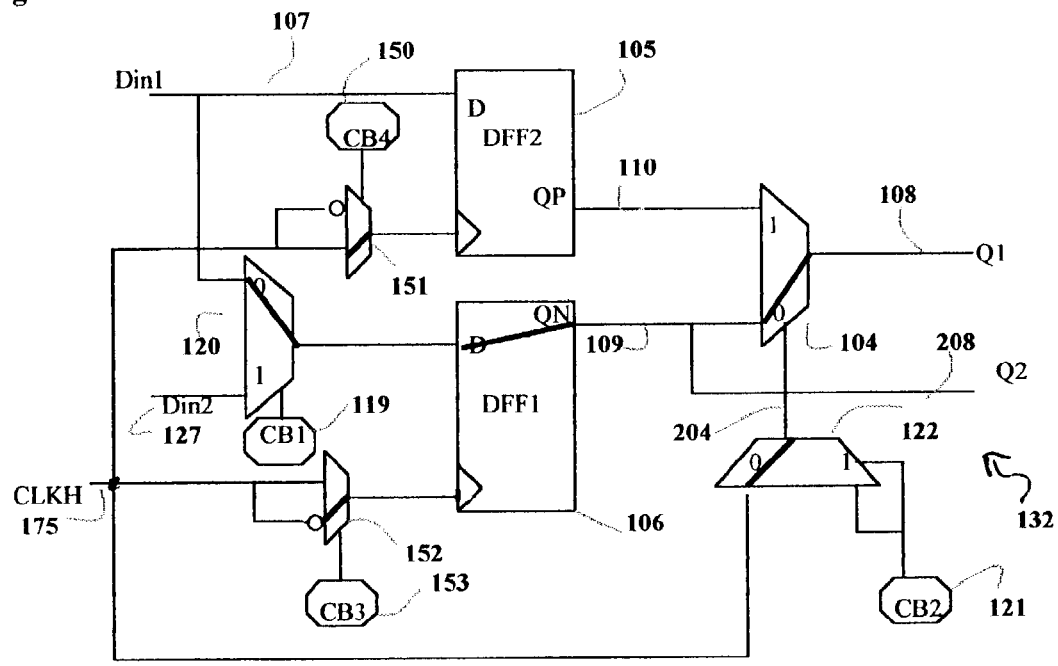
FIG. 7 shows the internal state of the dual-edge-triggered D flip-flop system of FIG. 5 at CLK=0 for dual edge configuration mode according to an embodiment of the invention.

FIG. 7 illustrates the dual-edge-triggered mode of an embodiment of the present invention for the negative-clock edge. CB1 119 is now configured as "0", so that, input Din1 107 becomes a common input for both flip-flops DFF1 106 and DFF2 105. Configuration bit CB4 150 is configured to select the normal clock 175 for DFF2 105 and, hence, DFF2 105 operates as a positive-edge-triggered flip-flop. Configuration bit CB3 153 is configured to select the inverted clock 175 for DFF1 106 and, hence, DFF1 106 operates as a negative-edge-triggered flip-flop. In this configuration, DFF1 106 registers the data Din1 107 at the negative edge of the clock 175 while DFF2 105 registers the data Din1 107 at the positive edge of the clock 175.

Multiplexer 120 selects Din1 107 as the data input for flip-flop 106 and sets the valid output at QN 109. Multiplexer 122 compensates for the clock-to-output delay of flip-flop 106 and sets select line 204 to "0" in response to clock signal 175 having a "0" level. Accordingly, select line 204 selects output QN 109 for final output Q1 108.

Figure 8:
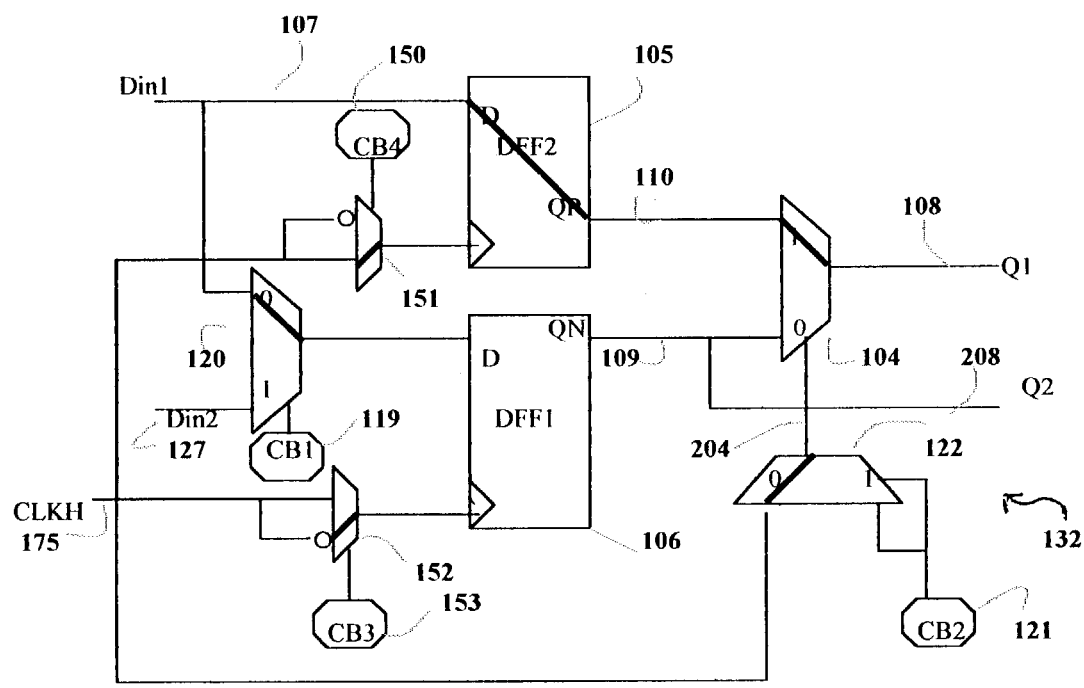
FIG. 8 shows the internal state of the dual-edge-triggered D flip-flop system of FIG. 5 at CLK=1 for dual edge configuration mode according to an embodiment of the invention.

At the positive edge of the clock 175 as shown in FIG. 8, flip-flop 105 registers the data Din1 107 and sets the valid output at QP 110. Multiplexer 122 compensates for the clock-to-output delay of flip-flop 105 and sets select line 204 to "1" according to clock signal 175 having a "1" level. The select line 204 selects the output QP 110 for final output Q1 108. This enables a single data line to be used to register the data at both the edges of the clock signal. At the positive edge of the clock cycle, DFF2 105 acts as a receiver for data input Din 107 and as a driver for output Q 108 while at the negative edge of the clock cycle, DFF1 106 becomes the receiver for data input Din 107 and a driver for output Q 108. In this manner, the combination behaves like a dual-edge-triggered D flip-flop 132.

Figure 9:
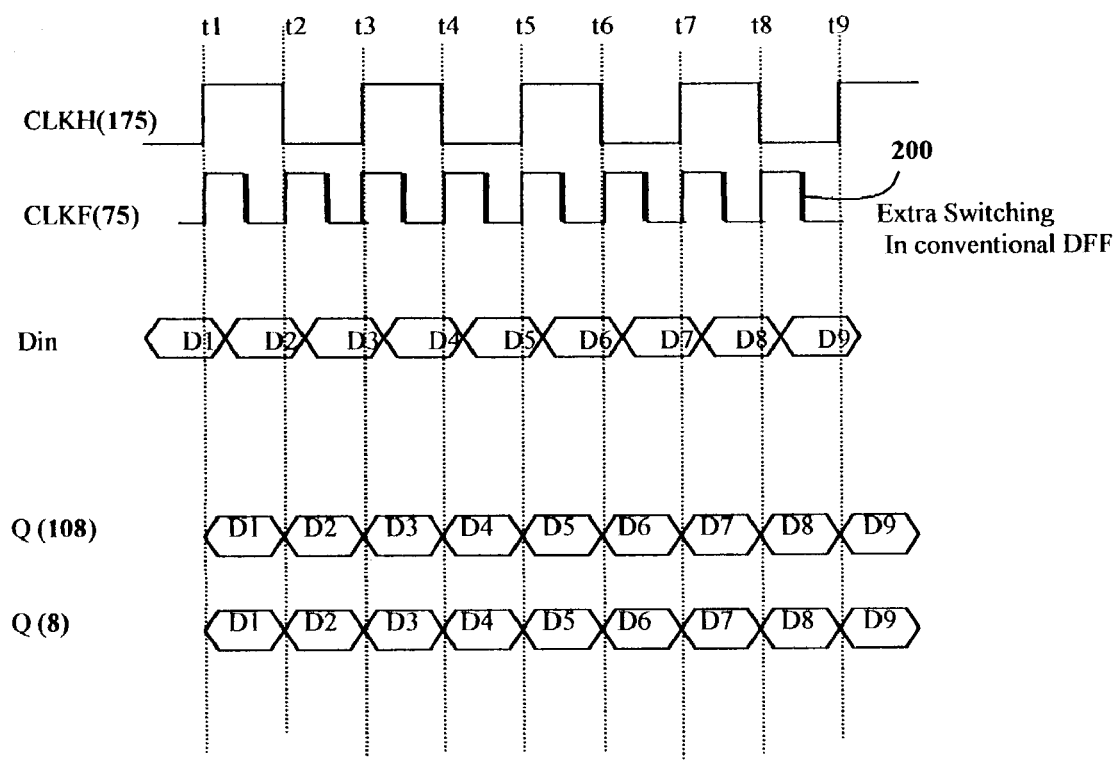
FIG. 9 shows timing diagrams for single edge and dual edge triggered D flip-flop operations according to an embodiment of the invention.

FIG. 9 shows the timing for different clock cycles and for the active flip-flop during a particular clock cycle. The timing diagram shows the operation for both the dual-edge operation as well as the conventional simple single positive-edge-triggered D operation. Before t=t1, when CLKH="0", the value of DFF2 105 cannot be reflected by data input Din 107, but, at t=t1 when CLKH changes from "0" to "1", the last data input Din 107 D1 (at t=t1) is registered into DFF2 105. This latched data is transmitted to output Q 108 after t=t1 when CLKH=1 (using 1st input of multiplexer 104). This is similar to the operation of a simple single positive-edge-triggered D flip-flop. At CLKH=1, the value of DFF1 106 can-not be changed by changing data input Din 107 but at t=t2, when CLKH changes from "1" to "0", the last data input Din 107 D2 (at t=t2) is registered into DFF1 106 and this latched data is transmitted to output Q 108 after t=t2 when CLKH=0 (using $0^{th}$ input of multiplexer 104). This operation is similar to that of a negative-edge-triggered D flip-flop. Therefore, this emodiment of the present invention operates as a dual-edge-triggered D flip-flop system that can access the data both at the rising (positive) edge and falling (negative) edge of a clock cycle. This renders this emodiment of the present invention capable of handling twice the data rates as compared to a conventional positive-(rising) edge-triggered flip-flop. That is, for the same data rate, the dual-edge-triggered D flip-flop 132 can operate at half the clock speed of the conventional flip-flop 32 (FIG. 2). In the case of conventional single-rising-edge D flip-flop 32 there is an extra switching 200 that consumes extra power in the clock system. The extra power consumption can be avoided by using the dual-edge-triggered D flip-flop facility 132 while maintaining the efficiency of the system.

Figure 10:
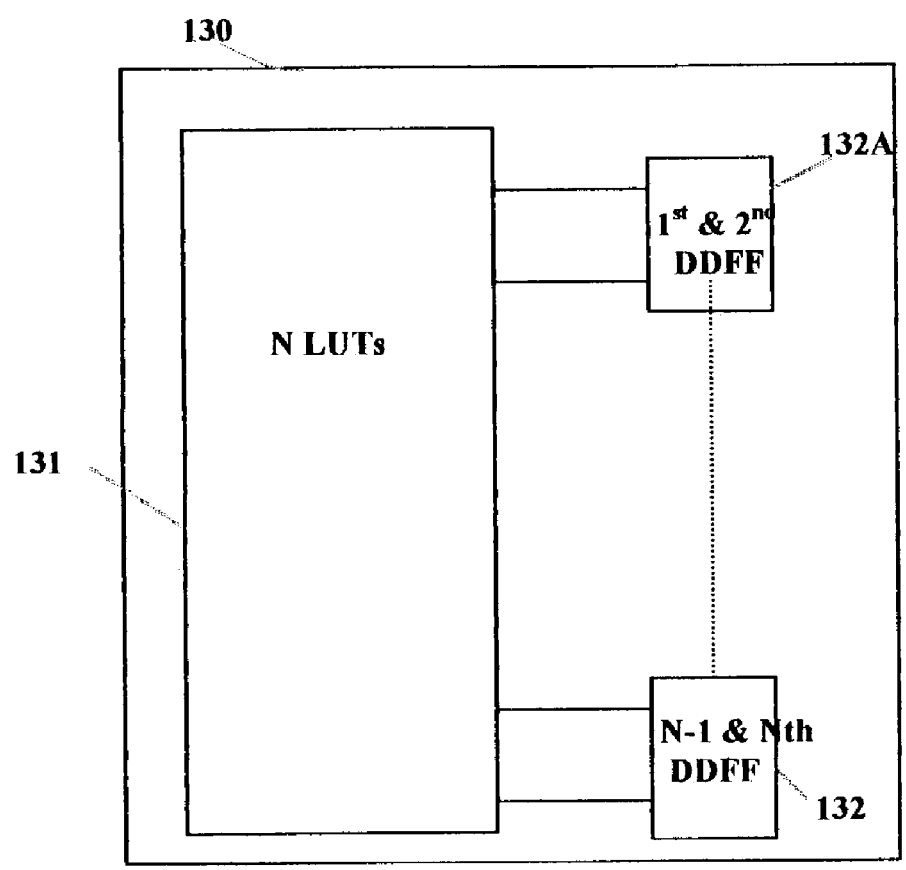
FIG. 10 shows the block diagram of a PLD logic block using the dual-edge-triggered D flip-flop system according to an embodiment of the invention.

FIG. 10 shows a PLB 130 according to an embodiment of the present invention. The PLB consists of LUTs 131 and the dual-edge-triggered D flip-flop system 132.

Furthermore, the PLB 130 may be incorporated into an integrated circuit, such as a Programmable Logic Circuit, which may, in turn, be incorporated into an electronic system such as a computer system.

It will be apparent to those with ordinary skill in the art that the foregoing is merely illustrative intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is, therefore, not limited by the description contained herein or by the drawings.

What is claimed is:

1. A Programmable Logic Device providing reduction in the power consumption for sequential logic and data storage functions, comprising at least one circuit arrangement including two single-edge-triggered flip-flops that function as a dual-edge-triggered flip-flop operating on both edges of a circuit clock and also function as two independent single-edge-triggered flip-flops operating on a single edge of the circuit clock, with the circuit arrangement being configurable to operate the two single-edge-triggered flip-flops as either a single dual-edge-triggered flip-flop or as two independent single-edge-triggered flip-flops.

2. A Programmable Logic Device as claimed in claim 1, wherein the circuit arrangement comprises two flip-flops, one of which is capable of being configured as rising-edge-triggered while the other is configured as falling-edge-triggered with one of the flip-flops latching data each time the clock changes state while the other remains inactive, the outputs from two flip-flops being selectively enabled as the dual-edge-triggered output by the clock signal.

3. A Programmable Logic Device as claimed in claim 1, wherein the dual-edge-triggered-flip flop comprises two single-edge-triggered flip-flops triggered by two clock sources that are configurable as complimentary clocks for dual-edge-triggered operation or as clocks with the same polarity for single-edge-triggered operation.

4. A Programmable Gate Array (PGA) providing reduction in power consumption for sequential logic and data storage functions, comprising at least one circuit arrangement that functions both as a dual-edge-triggered flip-flop operating on both edges of the circuit clock and also functions as two independent single-edge triggered flip-flops operating on a single edge of the circuit clock, with the circuit arrangement being configurable to operate the two single-edge-triggered flip-flops as either a single dual-edge-triggered flip-flop or as two independent single-edge-triggered flip-flops.

5. A Programmable Gate Array as claimed in claim 4, wherein the circuit arrangement comprises two flip-flops, one of which is capable of being configured as rising-edge-triggered while the other is configured as falling-edge-triggered with one of the flip-flops latching data each time the clock changes state while the other remains inactive, the outputs from two flip-flops being selectively enabled as the dual-edge-triggered output by the clock signal.

6. A method of enabling reduction in power consumption for sequential logic and data storage functions in a Programmable Logic Device, comprising the step of providing at least one circuit arrangement including two single-edge-triggered flip-flops that are configurable to function as a dual-edge-triggered flip-flop operating on both edges of a circuit clock and to function as two independent single-edge-triggered flip-flops operating on a single edge of the circuit clock with the method further including configuring the circuit arrangement to operate the two single-edge-triggered flip-flops as either a single dual-edge-triggered flip-flop or as two independent single-edge-triggered flip-flops.

7. A logic circuit, comprising:
a first input node operable to receive a first stream of data values;
a second input node operable to receive a second stream of data values; and
a programmable logic circuit coupled to the first and second input nodes and operable in a dual-edge-triggered mode to store a first data value on the first input node in response to an edge of a clock signal and to store a second data value on the first input node in response to an opposite edge of the clock signal, the stored first and second data values being sequentially provided on a first output, and the logic circuit operable in a single-edge-triggered mode to store the first data value on the first input node in response to the edge of the clock signal and to provide the stored value on the first output and operable to store the second data value on the second input node in response to the edge of the clock signal and to provide the stored value on a second output.

8. The logic circuit of claim 7 wherein the logic circuit comprises first and second single-edge-triggered flip flops.

9. The logic circuit of claim 7 wherein the programmable logic circuit is adapted to receive a plurality of configuration bits, the configuration bits collectively defining the mode of operation of the programmable logic circuit.

10. A configurable logic circuit, comprising:
a first input node operable to receive a first stream of data values;
a second input node operable to receive a second stream of data values;
a first output node;
a second output node;
a clock node operable to receive a clock signal having first-type and second-type edges; and
a flip-flop circuit coupled to the input nodes, output nodes, and clock node and, in a dual-edge-triggered mode, operable to,
latch a first data value on the first input node and provide the latched first data value on the first output node in response to a first-type edge of the clock signal, and
latch a second data value on the first input node and provide the latched second data value on the first output node in response to a second-type edge of the clock signal
and, in a single-edge-triggered mode, operable to
latch a first data value on the first input node and provide the latched value on the first output node responsive to the first-type edge of the clock signal, and
latch a second data value on the second input node and provide the latched value on the second output node responsive to the first-type edge of the clock signal.

11. The logic circuit of claim 10 wherein the flip-flop circuit comprises:
a first D flip-flop that in the dual-edge-triggered mode is operable to latch the first data value and provide the latched first data value on the output node in response to the first-type edge of the clock signal; and
a second D flip-flop that in the dual-edge-triggered mode is operable to latch the second data value and provide the latched second data value on the output node in response to the second-type edge of the clock signal.

12. The logic circuit of claim 10 wherein:
the first-type edges of the clock signal comprise rising edges; and the second-type edges of the clock signal comprise falling edges.

13. The logic circuit of claim 10 wherein:
the first-type edges of the clock signal comprise falling edges; and
the second-type edges of the clock signal comprise rising edges.

14. A logic circuit, comprising:
first and second circuit input nodes;
first and second circuit output nodes;
a first flip-flop having an input node coupled to the first circuit input node, a clock node, and an output node;
a second flip-flop having an input node, a clock node, and an output node coupled to the second circuit output node;
a first multiplexor operable to couple the clock node of the second flip-flop to a clock signal in a first operational mode and to an inverted clock signal in a second operational mode;
a second multiplexor operable to couple the input node of the second flip-flop to the first circuit input node in a second operational mode and to the second circuit input node in the first operational mode; and
a third multiplexor operable to couple the output node of the first flip-flop to the first circuit output node in the first operational mode and to alternately couple the output nodes of the first and second flip-flops to the first circuit output node in the second operational mode.

15. The logic circuit of claim 14, further comprising a fourth multiplexor operable to couple the clock signal to a control node of the third multiplexor in the second operational mode.

16. A programmable logic block, comprising: a logic circuit, comprising,
a first input node operable to receive a first stream of data values;
a second input node operable to receive a second stream of data values; and
a programmable logic circuit coupled to the first and second input nodes and operable in a dual-edge-triggered mode to store a first data value on the first input node in response to an edge of a clock signal and to store a second data value on the first input node in response to an opposite edge of the clock signal, the stored first and second data values being sequentially provided on a first output, and the logic circuit operable in a single-edge-triggered mode to store the first data value on the first input node in response to the edge of the clock signal and to provide the stored value on the first output and operable to store the second data value on the second input node in response to the edge of the clock signal and to provide the stored value on a second output.

17. An integrated circuit, comprising:
a programmable logic block, comprising,
a logic circuit, comprising:
a first input node operable to receive a first stream of data values;
a second input node operable to receive a second stream of data values; and
a programmable logic circuit coupled to the first and second input nodes and operable in a dual-edge-triggered mode to store a first data value on the first input node in response to an edge of a clock signal and to store a second data value on the first input node in response to an opposite edge of the clock signal, the stored first and second data values being sequentially provided on a first output, and the logic circuit operable in a single-edge-triggered mode to store the first data value on the first input node in response to the edge of the clock signal and to provide the stored value on the first output and operable to store the second data value on the second input node in response to the edge of the clock signal and to provide the stored value on a second output.

18. An electronic system, comprising:
an integrated circuit, comprising,
a programmable logic block, comprising,
a logic circuit, comprising,
a first input node operable to receive a first stream of data values;
a second input node operable to receive a second stream of data values; and
a programmable logic circuit coupled to the first and second input nodes and operable in a dual-edge-triggered mode to store a first data value on the first input node in response to an edge of a clock signal and to store a second data value on the first input node in response to an opposite edge of the clock signal, the stored first and second data values being sequentially provided on a first output, and the logic circuit operable in a single-edge-triggered mode to store the first data value on the first input node in response to the edge of the clock signal and to provide the stored value on the first output and operable to store the second data value on the second input node in response to the edge of the clock signal and to provide the stored value on a second output.

19. A method, comprising:
during a first operational mode, storing a first data value from a first input signal in response to a first clock edge having a first polarity; and
during the first operational mode, storing a second data value from the first input signal in response to a second clock edge having a second polarity that is opposite to the first polarity;
during a second operational mode, storing a first data value from a first input signal in response to the first clock edge having a first polarity; and
during the second operational mode, storing a second data value from a second input signal in response to the first clock edge having the first polarity.

20. The method of claim 19, further comprising:
during the first operational mode, driving the stored first data value onto a first output node in response to the first clock edge; and
during the first operational mode, driving the stored second data value onto the first output node in response to the second clock edge.

21. The method of claim 19, further comprising:
during a second operational mode, storing a data value from the first input signal in response to a clock edge having the first polarity; and
during the second operational mode, storing a data value from a second input signal in response to a clock edge having the second polarity.

22. The method of claim 19 wherein the first operational mode comprises a reduced-power mode.

* * * * *